United States Patent [19]
Yu

[11] Patent Number: 6,100,120
[45] Date of Patent: Aug. 8, 2000

[54] METHOD OF LOCALLY FORMING A HIGH-K DIELECTRIC GATE INSULATOR

[75] Inventor: Bin Yu, Sunnyvale, Calif.

[73] Assignee: Advanced Micro Devices, Inc., Sunnyvale, Calif.

[21] Appl. No.: 09/309,928

[22] Filed: May 11, 1999

[51] Int. Cl.[7] .............. H01L 22/00; H01L 21/84
[52] U.S. Cl. ............ 438/151; 438/197; 438/287; 438/585
[58] Field of Search .................... 438/151, 197, 438/199, 287, 426, 585, 697, 778; 257/410, 411, 412

[56] References Cited

U.S. PATENT DOCUMENTS

| | | | |
|---|---|---|---|
| 4,084,108 | 4/1978 | Fujimoto | 307/238 |
| 5,674,771 | 10/1997 | Machida et al. | 438/396 |
| 5,858,843 | 1/1999 | Doyle et al. | 438/299 |
| 5,923,056 | 7/1999 | Lee et al. | 257/192 |
| 6,010,921 | 1/2000 | Soutome | 438/151 |

*Primary Examiner*—Donald L. Monin, Jr.
*Assistant Examiner*—Hoai Pham
*Attorney, Agent, or Firm*—Foley & Lardner

[57] ABSTRACT

A method of forming a dielectric gate insulator in a transistor is disclosed herein. The method includes depositing a layer of material over a semiconductor structure; depositing a covering layer over the layer of material; selectively creating an aperture in the covering layer, wherein an area of the layer of material is exposed; providing thermal oxidation to the exposed area of the layer of material to produce an oxidized area; providing a gate over the oxidized area; and removing the covering layer.

22 Claims, 4 Drawing Sheets

METHOD OF LOCALLY FORMING A HIGH-K DIELECTRIC GATE INSULATOR

FIELD OF THE INVENTION

The present invention is related to integrated circuit (IC) devices. More particularly, the present invention relates to a method of locally forming a high-k dielectric gate insulator in metal oxide semiconductor (MOS) transistors.

BACKGROUND OF THE INVENTION

Transistors are generally formed on the top surface of a semiconductor substrate. Typically, the semiconductor substrate is divided into a number of active and isolation regions through an isolation process, such as field oxidation or shallow trench isolation. A thin oxide is grown on an upper surface of the semiconductor substrate in the active regions. The thin oxide serves as the gate oxide for subsequently formed transistors.

Polysilicon gate conductors are formed in the active regions above the thin oxide. The gate conductor and thin oxide form a gate structure which traverses each active region, effectively dividing the active region into two regions referred to as a source region and a drain region. After formation of the polysilicon gates, an implant is performed to introduce an impurity distribution into the source/drain regions. Generally, source/drain regions are heavily doped with n-type or p-type dopants.

Transistor manufacturers continually work to decrease transistor size. Smaller transistors, of course, require smaller transistor component dimensions. As the critical transistor dimensions continue to decrease, the thickness of the gate oxide also needs to be reduced. Nevertheless, a major drawback to the decreased gate oxide thickness (e.g., <30 Å) is that direct tunneling leakage current increases as gate oxide thickness is decreased. To suppress gate leakage current, material with a high dielectric constant (k) can be used as a gate dielectric instead of the conventional gate oxides, such as thermally grown silicon dioxide.

High-k gate dielectric materials have advantages over conventional gate oxides. A high-k gate dielectric material with the same effective electrical thickness (same capacitive effect) as a thermal oxide is much thicker physically than the conventional oxide. Being thicker physically, the high-k dielectric gate insulator has less direct tunnel leakage current. Tunnel leakage current is exponentially proportional to the gate dielectric thickness. Thus, using a high-k dielectric gate insulator significantly reduces the direct tunneling current flow through the gate insulator.

High-k materials include, for example, aluminum oxide ($Al_2O_3$), titanium oxide ($TiO_2$), and tantalum pentaoxide ($TaO_5$). $Al_2O_3$ has a dielectric constant (k) equal to eight (8) and is relatively easy to make as a gate insulator for a very small transistor. Small transistors often have a gate physical length less than 80 nm.

Despite its advantages, high-k materials pose IC fabrication challenges. For example, high-k material is relatively difficult to etch, unlike conventional thermal oxide. Residual material associated with chemical etchants for high-k materials can contaminate the IC wafer. As such, a new etching recipe, or method, needs to be developed for different high-k materials. Furthermore, high-k material is usually deposited or sputtered onto the silicon wafer. Deposition or sputtering results in an unsatisfactory uniformity of thickness across the wafer.

Thus, there is a need for a method of forming a high-k dielectric gate insulator in MOS transistors that does not use chemical etching processes. Further, there is a need for a method of forming a high-k dielectric gate insulator with a satisfactory uniform thickness. Even further, there is a need for the formation of a high-k insulator which is self-aligned to the gate area of both n- and p-channel transistors.

SUMMARY OF THE INVENTION

One embodiment of the invention relates to a method of forming a dielectric gate insulator in a transistor. The method includes depositing a layer of material over a semiconductor structure; depositing a mask layer over the layer of material; selectively creating an aperture in the mask layer, wherein an area of the layer of material is exposed; providing thermal oxidation to the exposed area of the layer of material to produce an oxidized area; providing a gate over the oxidized area; and removing the mask layer.

Another embodiment of the present invention relates to a thin dielectric gate structure for a transistor. The gate structure includes a semiconductor structure, a gate located proximate the semiconductor structure, and a gate insulator disposed intermediate the semiconductor structure and the gate. The gate insulator is formed of a material with a high dielectric constant and has a substantially uniform thickness.

Another embodiment of the present invention relates to a transistor having a thin dielectric gate insulator. The transistor includes a semiconductor structure, a gate located proximate the semiconductor structure, a gate insulator disposed intermediate the semiconductor structure and the gate, a source region, a drain region, and extensions located in the semiconductor structure. The extensions extend at least partially below the gate. The gate insulator is formed of a material with a high dielectric constant and has a substantially uniform thickness.

Another embodiment of the invention relates to a method of manufacturing a gate stack. The method includes forming a dielectric gate insulator using thermal oxidation and forming a gate conductor over the dielectric gate insulator. The dielectric gate insulator and gate conductor form a gate stack.

BRIEF DESCRIPTION OF THE DRAWINGS

Preferred exemplary embodiments are described below with reference to the accompanying drawings, wherein like reference numerals denote like elements, and.

DETAILED DESCRIPTION OF THE PREFERRED EMBODIMENTS

Figure 1:
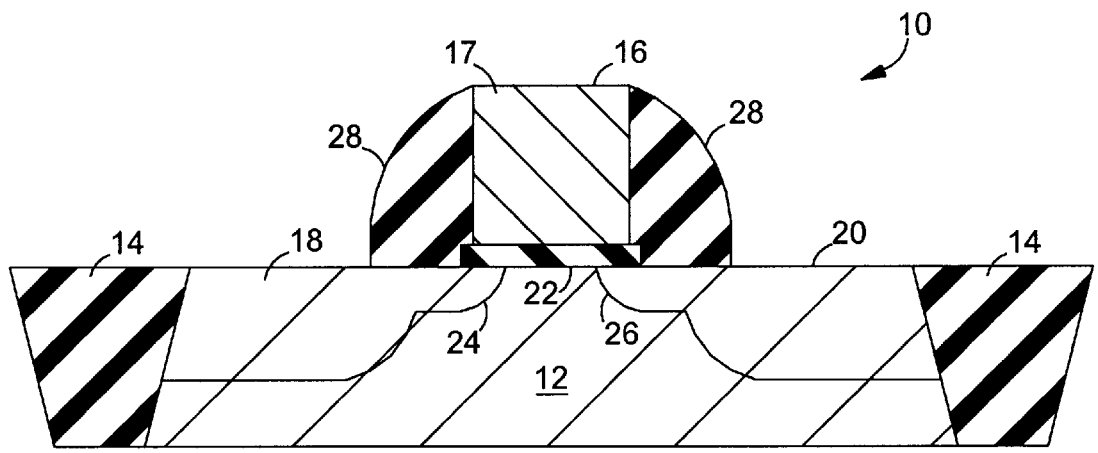
FIG. 1 is a cross-sectional view of a portion of an integrated circuit in accordance with an exemplary embodiment of the present invention.

Referring to FIG. 1, a cross-sectional view of a portion 10 of an integrated circuit is illustrated in accordance with an exemplary embodiment of the present invention. Portion 10 includes a substrate 12, isolation regions 14, a gate structure 16, a source region 18, a drain region 20, a source extension 24, a drain extension 26, and spacers 28.

Substrate 12 is any of a variety of semiconductor materials. Isolation regions 14 are shallow trench isolation (STI) structures which divide substrate 12 into a plurality of active regions. The portion of substrate 12 between isolation regions 14 is an active region. Alternatively, field oxidation is used as an isolation process to divide substrate 12 into various active regions.

Gate stack or structure 16 is aligned between source region 18 and drain region 20. Gate structure 16 includes a gate conductor 17 and a gate insulator 22. Gate structure 16 operates as an electrical switch for a stream of electrical charges, or "current," to pass from source region 18 to drain region 20. Source region 18 and drain region 20 are areas in portion 10 including impurities or dopants such as a p-type dopant (e.g., boron) or an n-type dopant (e.g., phosphorous).

Gate insulator 22 is a material with a high dielectric constant (k) disposed between substrate 12 and gate structure 16. In an exemplary embodiment, gate insulator 22 is aluminum oxide ($Al_2O_3$). The aluminum oxide preferably has a physical thickness of 150–180 Å, which has a corresponding electrical equivalent oxide thickness (capacitive effect) of 18–22 Å. Thus, electrically, gate insulator 22 operates as a very thin component in portion 10.

Source extension 24 and drain extension 26 are extensions of source region 18 and drain region 20, respectively, which are disposed partially underneath gate 16 to enhance transistor performance. Shallow source extension 24 and drain extension 26 help to achieve immunity to short-channel effects which degrade transistor performance for both n-channel and p-channel transistors. Short-channel effects can cause threshold voltage roll-off and drain-inducted barrier-lowering.

Spacers 28 are preferably silicon dioxide ($SiO_2$) structures which abut lateral sides of gate structure 16 and are provided over source extension 24 and drain extension 26. Alternatively, other spacer materials, such as, silicon nitride ($Si_3N_4$), silicon oxynitride (SiNO), or other insulators can be used.

Figure 2:
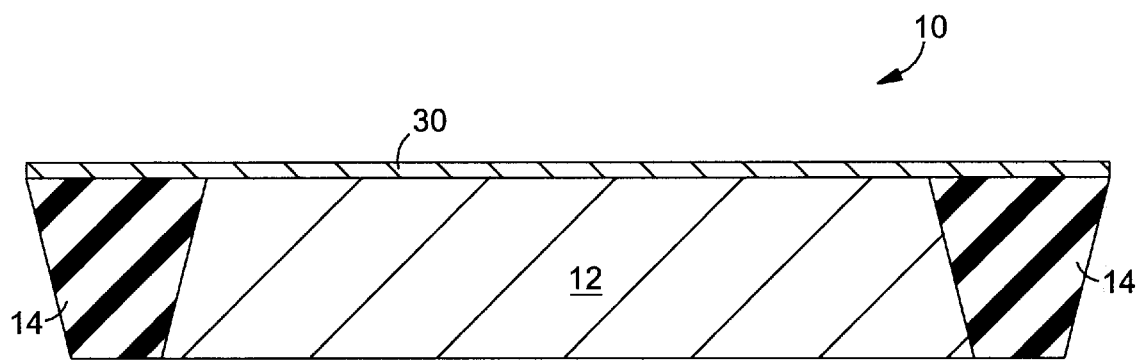
FIG. 2 is a cross-sectional view of the portion of the integrated circuit of FIG. 1, illustrating a metal deposition step in a method utilized to form a CMOS transistor with a high-k dielectric gate insulator in accordance with the present invention.

The method of forming portion 10 is described below with reference to FIGS. 1–8. The method advantageously forms portion 10 including a self-aligned high-k gate dielectric. In FIG. 2, a cross-sectional view of portion 10 illustrates a deposition step of a metal layer 30 over substrate 12. Metal layer 30 is deposited uniformly across substrate 12 using any of a variety of deposition techniques. Metal layer 30 is aluminum, titanium, tantalum, or any of a variety of metal materials. In an exemplary embodiment, metal layer 30 is a thin aluminum film or layer with a thickness of 100–120 Å. Alternatively, metal layer 30 can be titanium (Ti) or tantalum (Ta).

Figure 3:
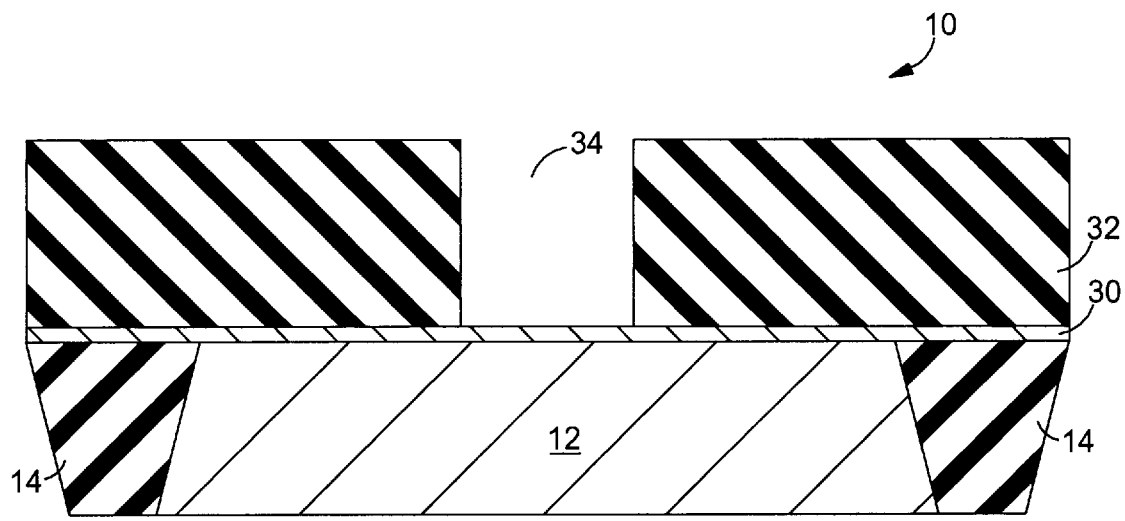
FIG. 3 is a cross-sectional view of the portion of the integrated circuit of FIG. 1, illustrating a mask step in the method utilized to form a CMOS transistor with a high-k dielectric gate insulator.

In FIG. 3, a cross-sectional view of portion 10 illustrates a deposition step of a covering or mask layer 32 over metal layer 30. Mask layer 32 is a layer of any material which does not undergo oxidation during the oxidization of metal layer 30. In an exemplary embodiment, mask layer 32 is a silicon nitride layer with a thickness of 1000–2000 Å. Deposition of mask layer 32 in the exemplary embodiment occurs at a low temperature, such as 250–300° C.

After the deposition of mask layer 32, an aperture 34 is selectively created in mask layer 32, serving as a covering layer. Aperture 34 is preferably created by a photolithographic process. Aperture 34 is 80–200 Å wide. Creation of aperture 34 occurs where gate structure 16 (FIG. 1) will be formed later in the fabrication process.

Figure 4:
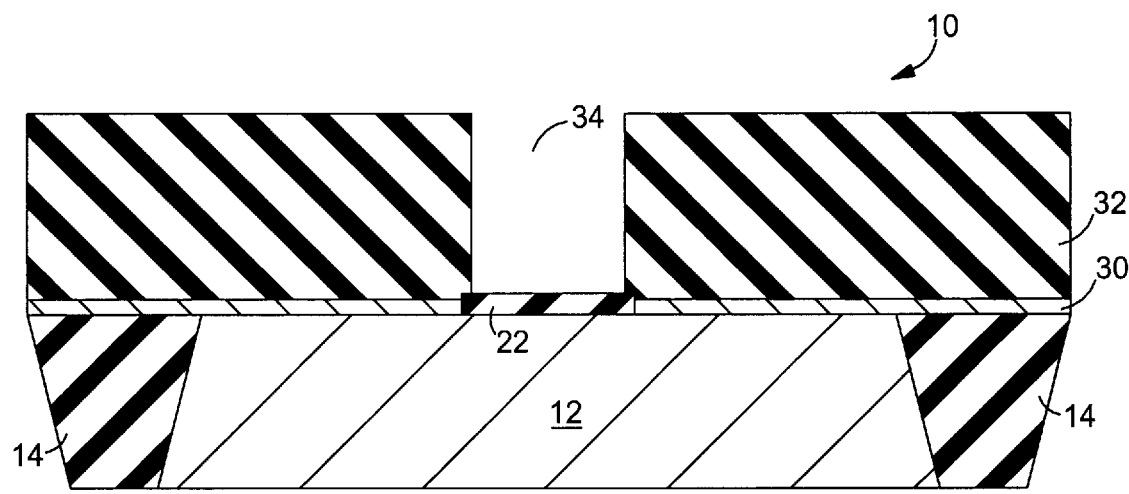
FIG. 4 is a cross-sectional view of the portion of the integrated circuit of FIG. 1, illustrating an oxidation step in the method utilized to form a CMOS transistor with a high-k dielectric gate insulator.

In FIG. 4, a cross-sectional view of portion 10 illustrates a thermal oxidation step in which the portion of metal layer 30 exposed by aperture 34 is thermally oxidized. Local thermal oxidation of metal layer 30 creates gate insulator 22. The temperature of the thermal oxidation depends on the temperature required to oxidize the metal of metal layer 30. Insulator 22 grows vertically as well as horizontally.

In an exemplary embodiment, metal layer 30 is aluminum, which is preferably oxidized at a temperature such as 250–300° C. The local oxidation of the aluminum creates aluminum oxide ($Al_2O_3$) as gate insulator 22. Aluminum oxide is a material with a high dielectric constant (k). Preferably, gate insulator has a physical thickness of 150–180 Å and is 84–210 Å wide (e.g., less than five percent wider than aperture 34). The corresponding electrical equivalent oxide thickness is 18–22 Å. Alternatively, insulator 22 can be titanium dioxide ($TiO_2$) or tantalum pentaoxide ($Ta_2O_5$). Gate insulator 22 has a substantially uniform thickness, or in other words, there is less than ten percent deviation in thickness.

Advantageously, formation of gate insulator 22 does not require sputtering or deposition. Gate insulators formed by sputtering or deposition have an undesirable, non-uniform thickness. Therefore, the disadvantage of non-uniform thickness due to sputtering or deposition is avoided. Gate insulator 22 formed by local thermal oxidation also has a much better interface quality between gate conductor 17 (FIG. 1) and substrate 12. Furthermore, formation of gate insulator 22 does not require etching of the high-k material. As such, the difficult task of etching a high-k dielectric material is advantageously avoided.

Figure 5:
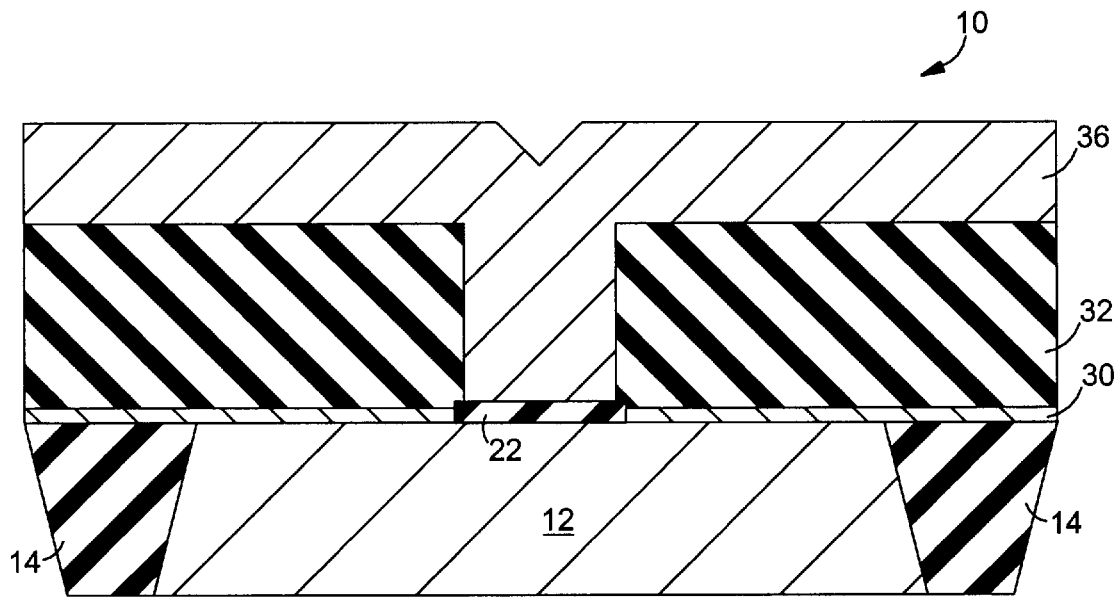
FIG. 5 is a cross-sectional view of the portion of the integrated circuit of FIG. 1, illustrating a gate conductor deposition step in the method utilized to form a CMOS transistor with a high-k dielectric gate insulator.

In FIG. 5, a cross-sectional view of portion 10 illustrates a deposition step of a gate material layer 36 over covering layer 32 and in aperture 34. Gate material layer 36 is any of a variety of metals, such as, Tungsten (W), Molybdenum (Mo), or other material used to form gate 16. In an exemplary embodiment, gate material layer 36 is 3000–4000 Å thick. Alternatively, material 36 can be polysilicon.

Figure 6:
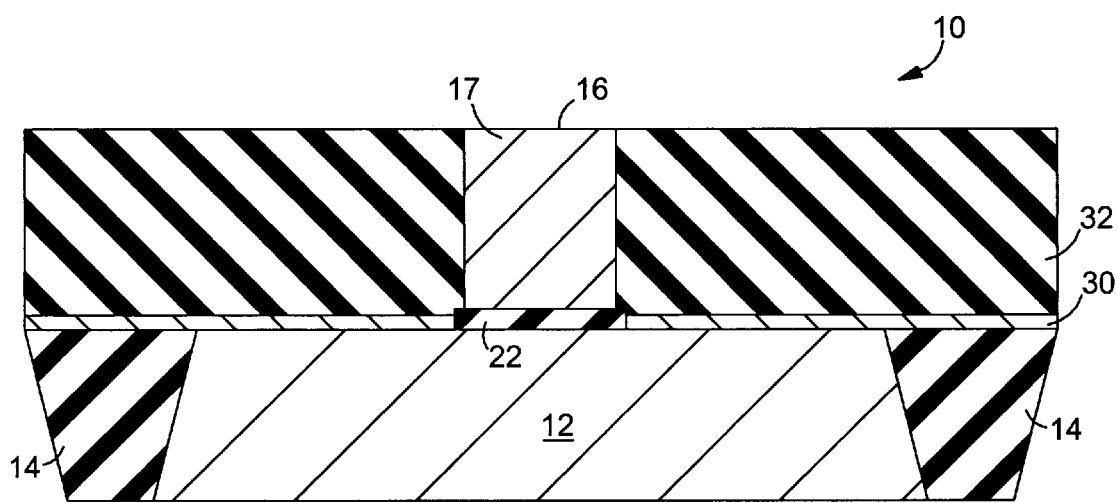
FIG. 6 is a cross-sectional view of the portion of the integrated circuit of FIG. 1, illustrating a planarization step in the method utilized to form a CMOS transistor with a high-k dielectric gate insulator.

In FIG. 6, a cross-sectional view of portion 10 illustrates a removing step in which gate material layer 36 is removed down to mask layer 32. In an exemplary embodiment, gate material layer 36 is removed by chemicalmechanical polishing (CMP). Alternatively, other removal processes may be used. In this removing step, mask layer 32 functions as an etching stop layer. After removal of the portion of gate material layer 36 down to mask layer 32, the remaining portion of gate material layer 36 occupies the area where aperture 34 was located (FIG. 4) and defines gate structure 16.

Figure 7:
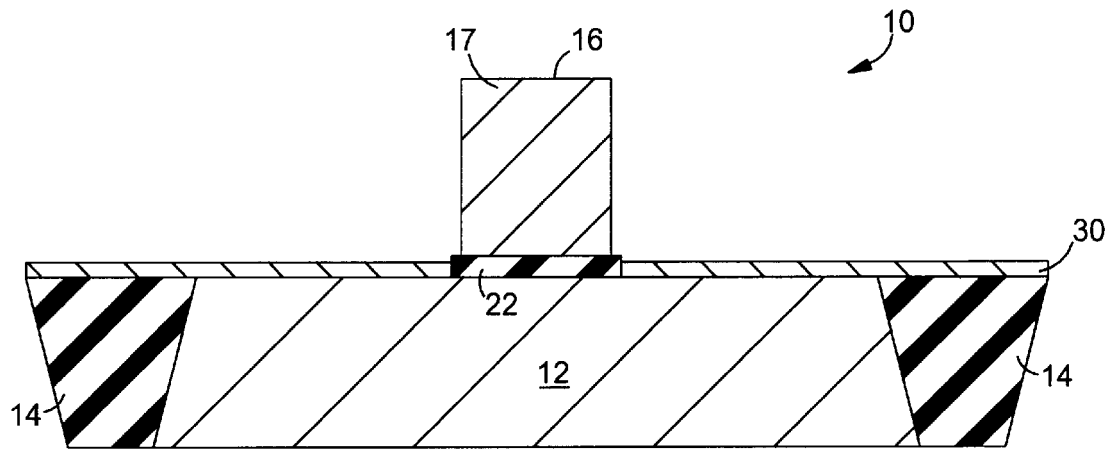
FIG. 7 is a cross-sectional view of the portion of the integrated circuit of FIG. 1, illustrating a mask removal step in the method utilized to form a CMOS transistor with a high-k dielectric gate insulator.

In FIG. 7, a cross-sectional view of portion 10 illustrates a removing step in which mask layer 32 is removed. In an exemplary embodiment, mask layer 32 is removed by chemical wet etching (e.g., hot $H_3PO_4$ acid). Alternatively, other removal processes can be used to remove covering layer 32.

Figure 8:
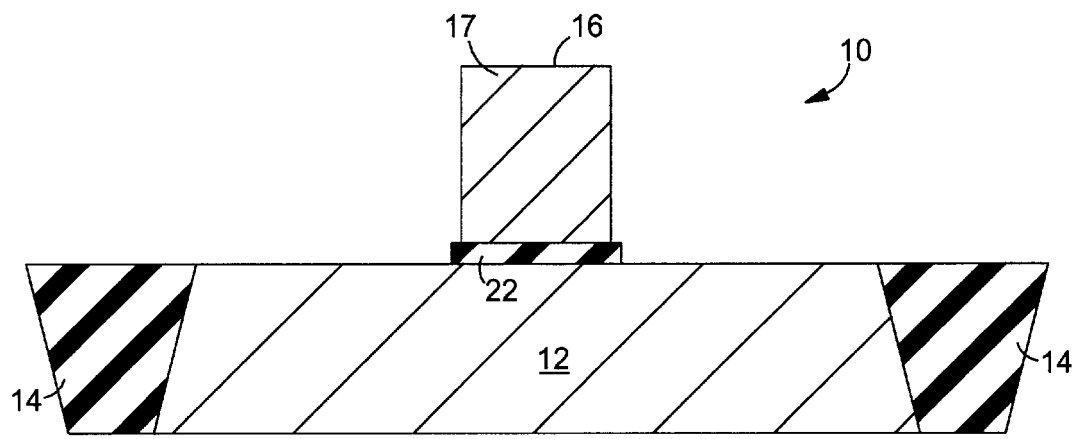
FIG. 8 is a cross-sectional view of the portion of the integrated circuit of FIG. 1, illustrating a metal removal step in the method utilized to form a CMOS transistor with a high-k dielectric gate insulator.

In FIG. 8, a cross-sectional view of portion 10 illustrates a removing step in which metal layer 30 is removed without affecting gate insulator 22. In an exemplary embodiment, metal layer 30 is removed by wet chemical etching. After removal of metal layer 30, gate insulator 22 and gate 16 define a self-aligned gate stack 38.

Referring now to FIG. 1, the cross-sectional view illustrates portion 10 including structures added to portion 10 in conventional CMOS fabrication process steps after the steps illustrated in FIGS. 2–8. Such structures include, for example, source region 18, drain region 20, source extension 24, drain extension 26, and spacers 28. Other structures may also be formed in the manufacturing process.

While the embodiments illustrated in the FIGURES and described above are presently preferred, it should be understood that these embodiments are offered by way of example only. Other embodiments may include, for example, different techniques for providing a gate or removing layers deposited on portion 10. The invention is not limited to a particular embodiment, but extends to various modifications, combinations, and permutations that nevertheless fall within the scope and spirit of the appended claims.

What is claimed is:

1. A method of forming a dielectric gate insulator for a transistor, the method comprising:

depositing a layer of metal material over a semiconductor substrate;

depositing a covering layer over the layer of metal material;

selectively creating an aperture in the covering layer, wherein an area of the layer of metal material is exposed;

providing thermal oxidation to the exposed area of the layer of metal material to produce an oxidized metal layer as the dielectric gate insulator;

providing a gate conductive material over the oxidized metal layer; and removing the covering layer.

2. The method of claim 1, wherein the covering layer comprises a material which does not oxidize during the step of providing thermal oxidation to the exposed area of the layer of metal material.

3. The method of claim 1, wherein the selectively creating an aperture step is a photolithography process.

4. The method of claim 1, wherein the layer of metal material comprises aluminum.

5. The method of claim 4, wherein the providing thermal oxidation step provides aluminum oxidation at a temperature between 250–300° C.

6. The method of claim 1, wherein the providing a gate conductive material over the oxidized metal layer step further comprises depositing a metal layer over the covering layer and the oxidized metal layer and removing the metal layer to the covering layer, the remaining metal layer in the aperture defining a gate conductor.

7. The method as recited in claim 1, wherein said dielectric gate insulator is formed by thermal oxidation and without directly sputtering or depositing as a gate insulator.

8. The method of forming a gate structure as recited in claim 6, wherein said gate dielectric insulator is formed by thermal oxidation and without directly sputtering or depositing as a gate insulator.

9. A method of manufacturing an integrated circuit comprising:

providing a metal layer over a substrate;

providing a covering layer over the metal layer;

forming an aperture in the covering layer;

forming a dielectric gate insulator within the aperture using thermal oxidation; and forming a gate conductor over the dielectric gate insulator, the dielectric gate insulator and the gate conductor forming a gate stack.

10. The method of claim 9, wherein the forming the dielectric gate insulator step results in a material having a high dielectric constant.

11. The method of claim 9, wherein the dielectric gate insulator is formed without directly sputtering or depositing the dielectric gate insulator.

12. The method of claim 9, wherein the dielectric gate insulator is titanium oxide ($TiO_2$).

13. The method of claim 9, wherein the forming the dielectric gate insulator step provides a uniform thickness for the dielectric gate insulator.

14. The method of claim 9, wherein the forming the dielectric gate insulator step is selectively performed in a channel gate area.

15. The method of claim 14, wherein the dielectric gate insulator is formed without etching the gate dielectric insulator.

16. A method of forming a gate structure including high K gate dielectric layer, the method comprising the following steps of in the following order:

depositing a metal layer over a substrate;

depositing a mask layer over the metal layer;

etching the mask layer to form an aperture, the aperture defining a width of the high K gate dielectric layer;

oxidizing the metal layer to form the high K dielectric layer at a location of the aperture; and depositing a gate conductor over the gate dielectric layer.

17. The method of claim 16 further comprising the step of:

removing the gate conductor from above the mask layer and leaving the gate conductor in the aperture.

18. The method of claim 17 further comprising the step of:

removing the masking layer.

19. The method of claim 18 further comprising the step of:

wet etching the metal layer remaining after the removing the mask layer step.

20. The method of claim 16, wherein the gate conductor is polysilicon or metal.

21. The method of claim 16, wherein the metal layer is aluminum and the high K gate detector is oxidized aluminum.

22. The method of claim 16, wherein the metal layer is titanium and the high K gate dielectric is oxidized titanium.

* * * * *